United States Patent
Tanaka et al.

(10) Patent No.: US 7,508,849 B2
(45) Date of Patent: *Mar. 24, 2009

(54) WAVELENGTH TUNABLE LASER DEVICE

(75) Inventors: Shinsuke Tanaka, Kawasaki (JP); Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 225 days.

This patent is subject to a terminal disclaimer.

(21) Appl. No.: 11/020,241

(22) Filed: Dec. 27, 2004

(65) Prior Publication Data

US 2005/0265402 A1  Dec. 1, 2005

(30) Foreign Application Priority Data

May 25, 2004  (JP)  ............................... 2004-154820

(51) Int. Cl.
*H01S 3/10* (2006.01)
*H01S 3/13* (2006.01)
*H01S 3/00* (2006.01)
*H01S 3/04* (2006.01)

(52) U.S. Cl. ............... 372/20; 372/29.016; 372/29.011; 372/38.01; 372/9; 372/33; 372/28; 372/29.02; 372/32; 372/34

(58) Field of Classification Search .................... 372/20, 372/28, 29.016, 29.011, 38.01, 9, 33, 29.02, 372/32, 34
See application file for complete search history.

(56) References Cited

U.S. PATENT DOCUMENTS

| | | | |
|---|---|---|---|
| 5,798,859 A * | 8/1998 | Colbourne et al. .......... 359/247 |
| 6,400,737 B1 | 6/2002 | Broutin et al. ............... 372/20 |
| 7,130,322 B2 * | 10/2006 | Takabayashi et al. .. 372/29.016 |
| 2003/0012250 A1 * | 1/2003 | Shirasaki ..................... 372/98 |
| 2003/0016707 A1 | 1/2003 | McDonald et al. ............ 372/20 |
| 2003/0179790 A1 * | 9/2003 | Bouda et al. .................. 372/20 |
| 2005/0094680 A1 * | 5/2005 | Takabayashi et al. ......... 372/20 |

FOREIGN PATENT DOCUMENTS

| | | |
|---|---|---|
| EP | 1 349 245 | 10/2003 |
| JP | 2003-283024 | 10/2003 |

OTHER PUBLICATIONS

K. Takabayashi, et al.; "Widely (90nm) Wavelength Tunable Laser Using a Semiconductor Optical Amplifier and an Acousto-Optic Tunable Filter;" *Proc. Of ECOC*; vol. 4; 2003; p. 890-891./Discussed in the specification.
European Search Report dated Apr. 18, 2005.

* cited by examiner

*Primary Examiner*—Kenneth A Parker
*Assistant Examiner*—Hrayr A. Sayadian
(74) *Attorney, Agent, or Firm*—Kratz, Quintos & Hanson, LLP

(57) ABSTRACT

A semiconductor optical amplifier, an acousto-optic tunable filter, a phase shifter, a lens, and an internal etalon are arranged in a resonator. Outside the resonator, two lenses, two beam splitters, two photo-detectors, and an external etalon are arranged. The internal etalon is a quartz etalon and the external etalon is a crystal etalon. Therefore, the rate of change in transmission peak wavelength of the internal etalon to a temperature change is greater than that of the external etalon.

11 Claims, 5 Drawing Sheets

WAVELENGTH TUNABLE LASER DEVICE

CROSS-REFERENCE TO RELATED APPLICATIONS

This application is based upon and claims the benefit of priority from the prior Japanese Patent Application No. 2004-154820, filed on May 25, 2004, the entire contents of which are incorporated herein by reference.

BACKGROUND OF THE INVENTION

1. Field of the Invention

The present invention relates to a wavelength tunable laser device suitable for multi-wavelength communication systems and so forth.

2. Description of the Related Art

Along with dramatic increase in demands for communication in recent years, development of wavelength division multiplexing systems (WDM systems), which realize high-capacity transmission by a single optical fiber by way of multiplexing plural signal beams of different wavelengths, shows progress. For such wavelength division multiplexing systems, a wavelength tunable laser capable of selecting a desired wavelength from a wide range of wavelengths is strongly expected in building the systems.

As the wavelength tunable laser with a wide band, one having a semiconductor optical amplifier (SOA) and a wavelength tunable filter arranged in a resonator is described in Patent Document 1 (Japanese Patent Application Laid-Open No. 2003-283024). This laser realizes oscillation of a single longitudinal mode by selecting one of longitudinal modes of the laser resonator arranged in small wavelength intervals through use of two filters, that are, a wavelength tunable filter and an optical filter having a periodical transmission wavelength (hereinafter referred also to as an etalon). For example, in an SOA-AOTF laser using an acousto-optic tunable filter (AOTF) as the wavelength tunable filter, the oscillation of a single longitudinal mode is obtained in a wide range of wavelengths ($\Delta\lambda$=90 nm) (Non-Patent Document 1 (K. Takabayashi et al. Proc. of ECOC 2003 vol. 4 890)). Control of oscillation wavelength of the laser described above is conducted by the following two controls in combination.

A first control is a control to adjust the wavelength selected by the wavelength tunable filter to a desired transmission peak wavelength of an internal etalon. A second control is a control to adjust the oscillation wavelength to a desired wavelength (for example, an ITU grid) by adjusting a longitudinal-mode position of the resonator.

Accordingly, it is necessary to configure the resonator such that its resonator length (phase) is controllable in this wavelength tunable laser so as to control the longitudinal-mode position of the resonator. An example of methods of controlling the phase is one having the steps of inserting a semiconductor layer therein and injecting current into the semiconductor layer to control its refractive index. Another example is one having the step of changing a position of a mirror constituting the resonator.

As the wavelength tunable laser device capable of accurately controlling the oscillation wavelength of the laser through use of the above-described two controls, such a device is proposed that has an integrated wavelength locker including two beam splitters, two photo-detectors (PD), and an optical filter with a periodical transmission wavelength (hereinafter, referred to also as an external etalon) in the external part of the resonator.

This conventional wavelength tunable laser, however, can achieve the expected purpose but has difficulty dealing with a further improvement in accuracy.

SUMMARY OF THE INVENTION

An object of the present invention is to provide a wavelength tunable laser device capable of further improving the accuracy of wavelength control.

After due diligent efforts to bring a solution to the above-mentioned technical problems, the present inventors have found that there is difficulty in adjusting the respective transmission peak wavelengths of the internal etalon and the external etalon to the respective tolerance ranges, and in obtaining a sufficient accuracy of wavelength control in accordance therewith in the above-described conventional wavelength tunable laser device, and devised some aspects of the invention as will be described hereinbelow.

A first wavelength tunable laser device according to the present invention includes a semiconductor optical amplifier emitting a laser beam. A wavelength tunable filter is arranged in an optical path of the laser beam. A first optical filter with a periodical transmission wavelength is arranged in the optical path of the laser beam. Two reflective members resonating the laser beam are arranged so as to sandwich the semiconductor optical amplifier, the wavelength tunable filter, and the first optical filter therebetween. Further, A phase shifter controlling a phase of the laser beam resonating between the two reflective members are provided. The wavelength tunable laser device includes: a first unit to split light and a second unit to split light, each splitting a part of the laser beam passing through one of the two reflective members; a first optical detector detecting an intensity of the laser beam split by the first unit to split light; a second optical filter with a periodical transmission wavelength arranged in the optical path of the laser beam split by the second unit to split light; and a second optical detector detecting an intensity of the laser beam passing through the second optical filter. A rate of change in transmission peak wavelength of the first optical filter with a temperature change is greater than a rate of change in transmission peak wavelength of the second optical filter with the temperature change.

A second wavelength tunable laser device according to the present invention includes a circulation-type optical resonator including: a semiconductor optical amplifier emitting a laser beam; a wavelength tunable filter arranged in an optical path of the laser beam; a first optical filter with a periodical transmission wavelength arranged in the optical path of the laser beam; and a phase shifter controlling a phase of the laser beam. The circulation-type optical resonator further includes an optical demultiplexer taking out the laser beam to an external part. Further, the wavelength tunable laser device includes: a first unit to split light and a second unit to split light, each splitting a part of the laser beam taken out by the optical demultiplexer; a first optical detector detecting an intensity of the laser beam split by the first unit to split light; a second optical filter with a periodical transmission wavelength arranged in the optical path of the laser beam split by the second unit to split light; and a second optical detector detecting an intensity of the laser beam passing through the second optical filter. A rate of change in transmission peak wavelength of the first optical filter with a temperature change is greater than a rate of change in transmission peak wavelength of the second optical filter with the temperature change.

DETAILED DESCRIPTION OF THE PREFERRED EMBODIMENTS

Basic Principle of the Present Invention

Figure 1:
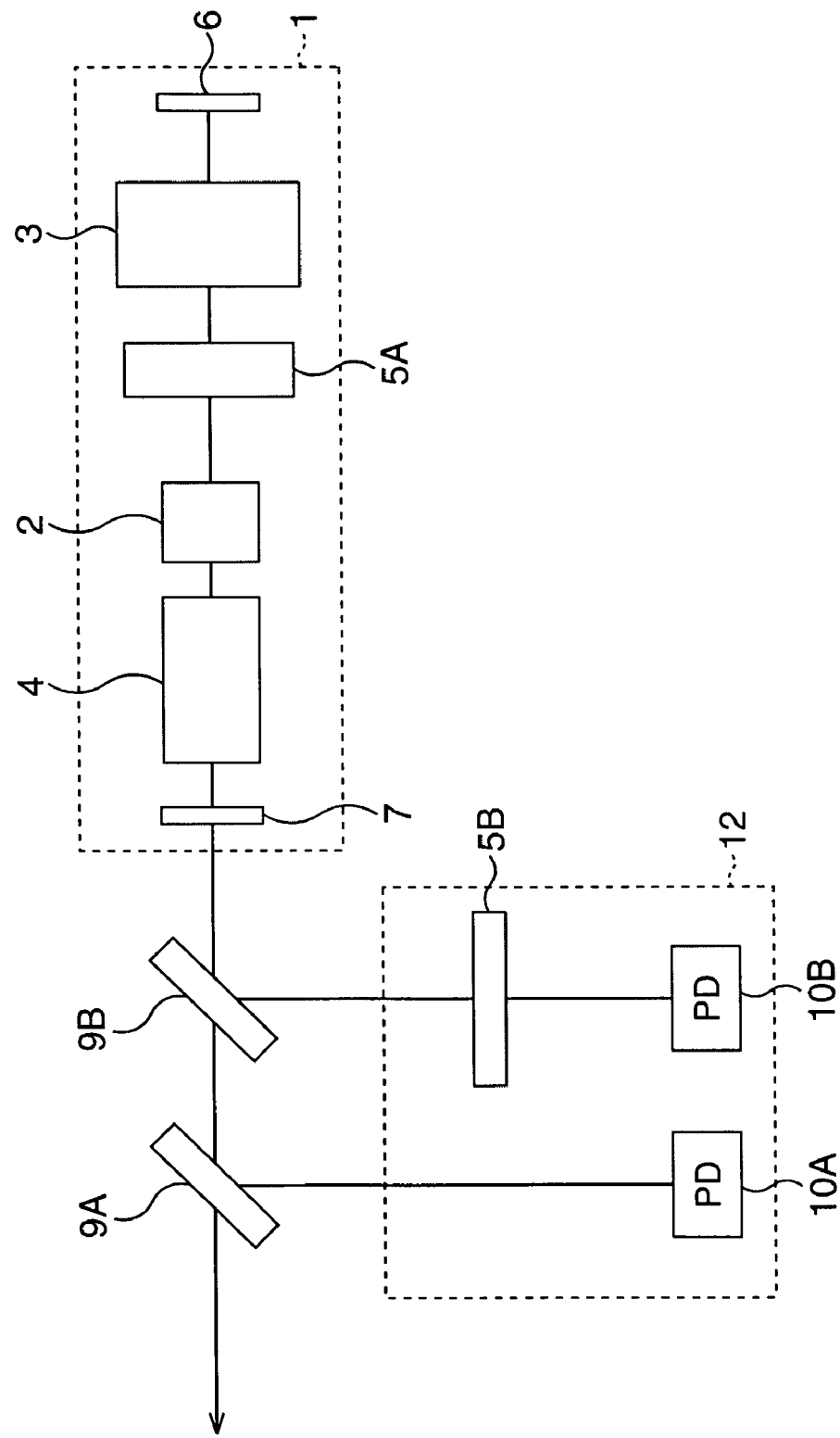
FIG. 1 is a schematic diagram showing an outline of a wavelength tunable laser device having an external etalon.

First, the basic principle of the present invention will be described. FIG. 1 is a schematic diagram showing an outline of a wavelength tunable laser device having an external etalon.

In this wavelength tunable laser device, a semiconductor optical amplifier (SOA) 4, a phase shifter 2, an internal etalon 5A and a wavelength tunable filter 3 are arranged between a pair of reflectors 6 and 7. They constitute a resonator 1. Further, outside the resonator 1, beam splitters 9B and 9A are arranged in order from the reflective film 7 side in a manner to keep the reflector 7 interposed between them and the reflector 6. The beam splitter 9B splits part of a laser beam outputted after being transmitted by the reflective film 7. At the destination of the split beam, a photo-detector (PD) 10B is arranged. Between the beam splitter 9B and the photo-detector 10B, an external etalon 5B is arranged. The beam splitter 9A splits part of the laser beam transmitted by the beam splitter 9B. At the destination of the split beam, a photo-detector (PD) 10A is arranged.

Generally, to achieve a high wavelength accuracy in the wavelength tunable laser device, it is necessary to adjust the transmission peak wavelength of the etalon to within a certain tolerance range with reference to a desired channel wavelength (for example, an ITU grid wavelength). This adjustment can be realized by, for example, adjusting the angle between the etalon and the path when the etalon is attached. Further, a change in refractive index of the material of the etalon to temperature can be used to adjust an error which could not be sufficiently adjusted even when the etalon is attached. In other words, by adjusting the temperature of the etalon, the transmission peak wavelength can be changed so that it falls within a desired range.

In some cases, however, sufficient adjustment cannot be made even when such angle adjustment and temperature adjustment are performed in a wavelength tunable laser device in which not only the internal etalon 5A but also the external etalon 5B are integrated. More specifically, when the transmission peak wavelength of the internal etalon 5A is adjusted to within the tolerance range by temperature adjustment, the transmission peak wavelength of the external etalon 5B also shifts concurrently. Further, errors when the etalons 5A and 5B are attached independently occur in the internal etalon 5A and the external etalon 5B. Therefore, as a result of temperature control of the internal etalon 5A, a shift by the temperature adjustment may be superimposed on the error in the external etalon 5B occurred during the attachment. In such a case, the transmission peak wavelength of the external etalon 5B may fall outside the tolerance range, leading to insufficient wavelength accuracy.

Figure 2:
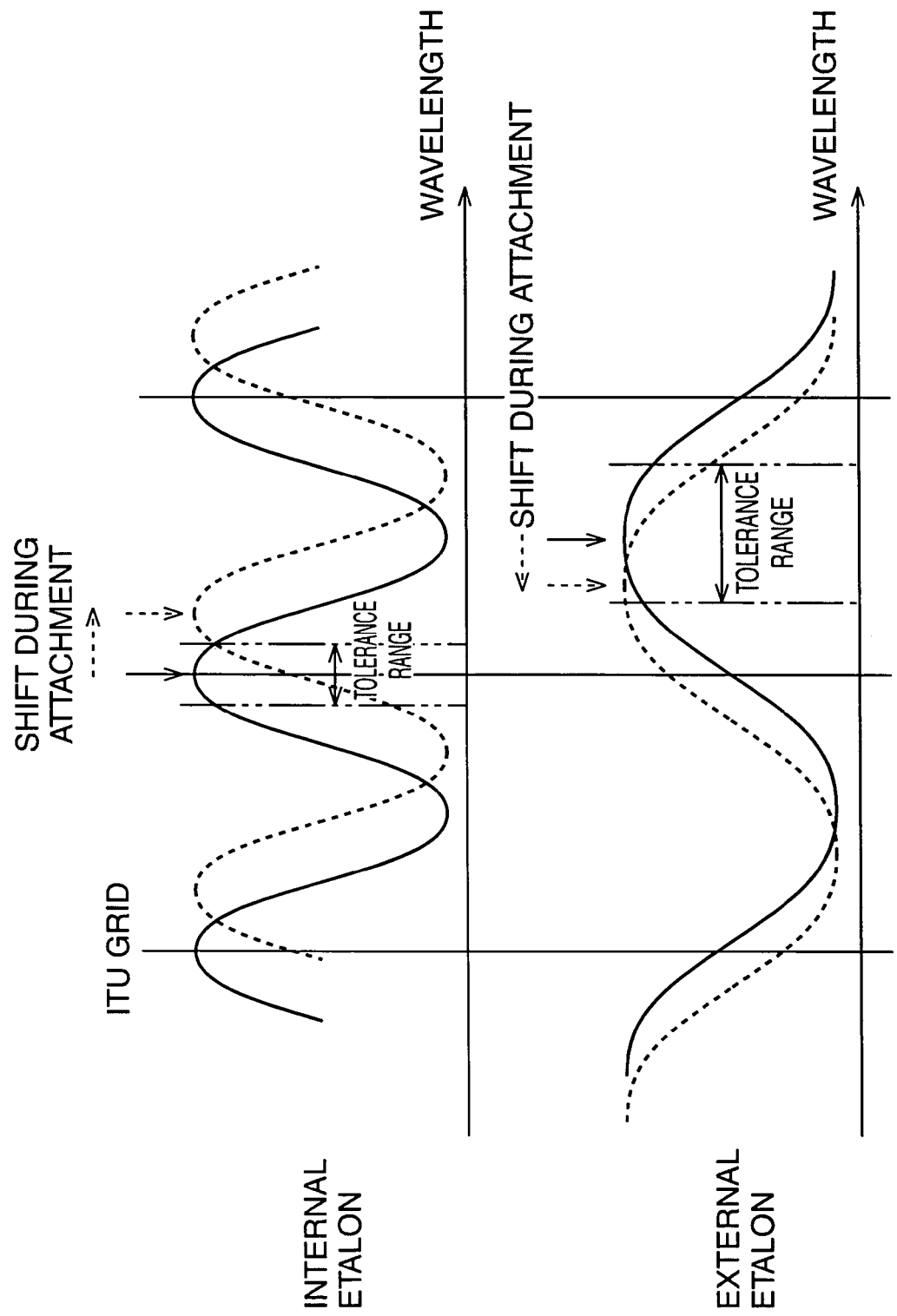
FIG. 2 is a diagram showing transmission spectra of an internal etalon 5A and an external etalon 5B.

Here, the tolerance of the transmission peak wavelength of the internal etalon 5A is narrower than the interval between the longitudinal modes of the laser, and its width is on the order of 1 GHz to 2 GHz. On the other hand, the width of the tolerance of the transmission peak wavelength of the external etalon 5B can be made one-third the channel interval or greater, though depending also on the performance of a photo-detector (PD) and a control circuit. For example, in the case of a channel interval of 50 GHz, the width of the tolerance of the external etalon 5B can be made 16 GHz or greater. Since the width of the tolerance of the internal etalon 5A is narrower than that of the external etalon 5B as described above, an error during attachment is apt to fall outside the tolerance range of the internal etalon 5A even though it falls within the tolerance range of the external etalon 5B. This relationship is shown in FIG. 2. Solid lines in FIG. 2 indicate transmission spectra with no error, and broken lines indicate transmission spectra when an error has occurred during attachment.

In such a situation, an etalon with a large rate of change in transmission peak wavelength with a temperature change is used as the internal etalon 5A, which has a narrow width of the tolerance of the transmission peak wavelength, while an etalon with a small rate of change in transmission peak wavelength with a temperature change is used as the external etalon 5B, which has a relatively wide width of the tolerance in the present invention.

This configuration makes it easy for each of the transmission peak wavelengths of the internal etalon 5A and the external etalon 5B to fall within the tolerance ranges. More specifically, if a conventional etalon is used as the internal etalon 5A and an etalon having a rate of change to temperature smaller than that of the conventional one is used as the external etalon 5B, the transmission peak wavelength of the external etalon 5B hardly changes so that the transmission peak wavelength of the external etalon 5B hardly falls outside the tolerance range. Alternatively, if a conventional etalon is used as the external etalon 5B and an etalon having a rate of change to temperature greater than that of the conventional one is used as the internal etalon 5A, the transmission peak wavelength of the internal etalon 5A can be made to fall within the tolerance range by a slight temperature change, so that the transmission peak wavelength of the external etalon 5B hardly falls outside the tolerance range. Further, if an etalon having a rate of change to temperature greater than that of a conventional one is used as the internal etalon 5A and an etalon having a rate of change to temperature smaller than that of a conventional one is used as the external etalon 5B, a temperature change required to correct the transmission peak wavelength of the internal etalon 5A can be made smaller than that of the conventional one, and the change in the transmission peak wavelength of the external etalon 5B with the temperature change becomes smaller.

Figure 3:
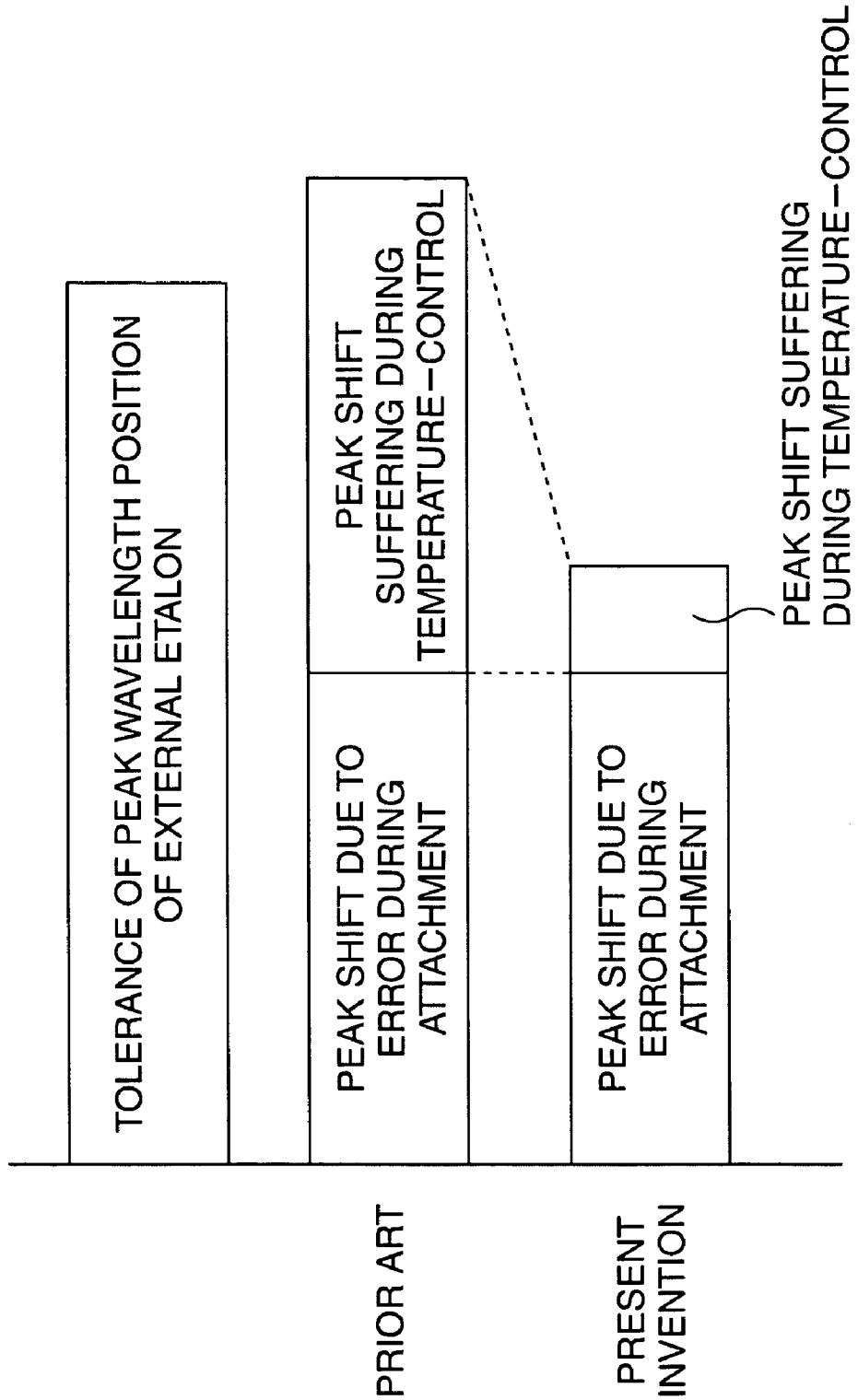
FIG. 3 is an illustration showing the relation between errors and a tolerance.

As described above, the shift amount of the transmission peak wavelength that the external etalon 5B suffers due to the correction by the temperature adjustment of the internal etalon 5A becomes extremely small as compared with a conventional one. As a result of this, the transmission peak wavelength of the external etalon 5B easily falls within the tolerance range even when an error due to the temperature control is superimposed on an error occurred during the attachment, as shown in FIG. 3. Accordingly, the transmission peak wavelengths of the two etalons 5A and 5B fall within the respective wavelength tolerance ranges, leading to a drastically improved wavelength accuracy as compared with a prior art.

Note that it is also possible to make such a configuration that two thermoelectric coolers (TECs) are used to temperature-control independently the internal etalon 5A and the external etalon 5B, but this configuration causes a problem of an increase in the number of parts and increase in power consumption as compared with a conventional device.

Figure 4:
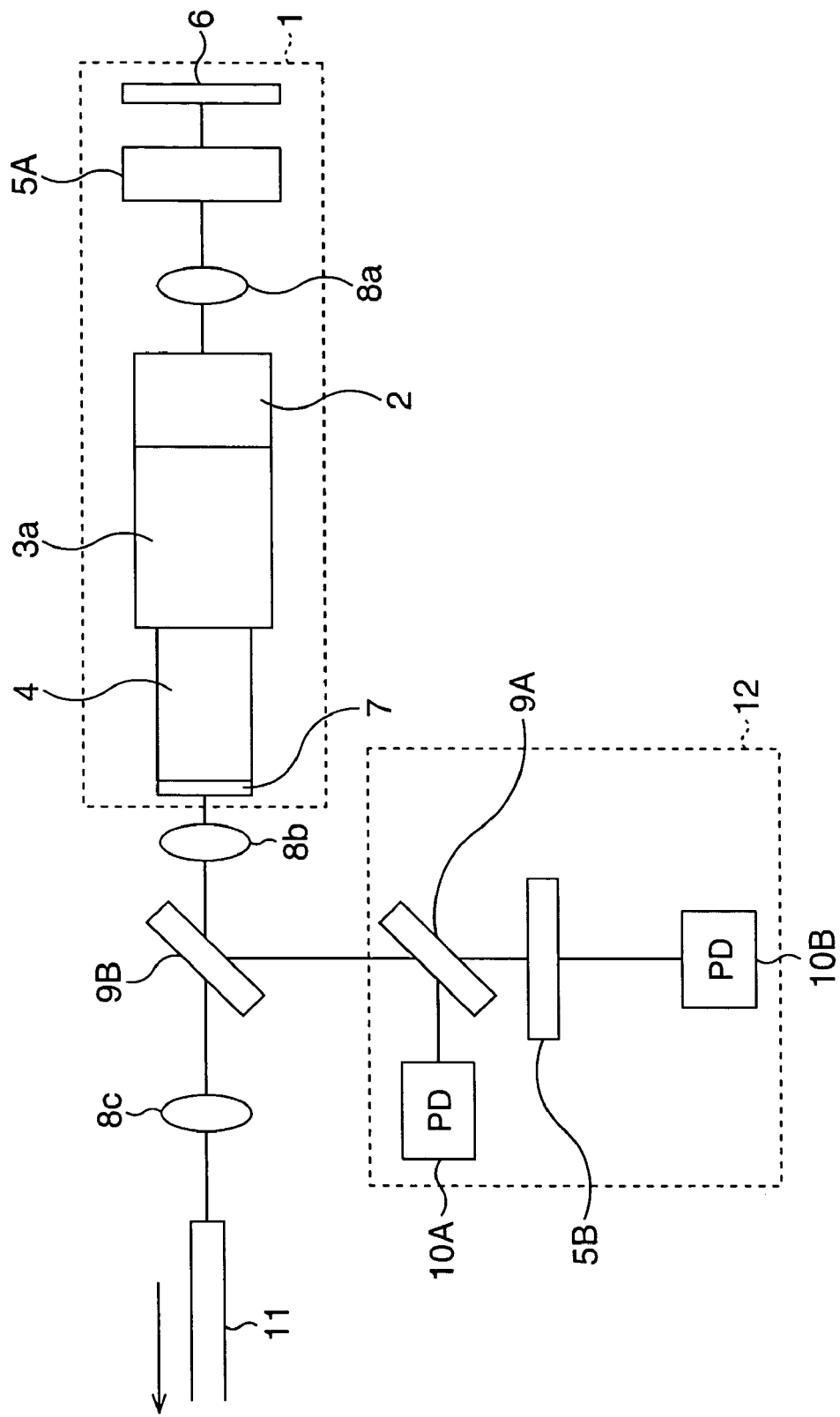
FIG. 4 is a schematic diagram showing a structure of a wavelength tunable laser device according to a first embodiment of the present invention.

Next, a wavelength tunable laser device according to an embodiment of the present invention will be concretely explained with reference to the accompanying drawings. FIG. 4 is a schematic diagram showing a structure of a wavelength tunable laser device according to a first embodiment of the present invention.

In the first embodiment, a semitransmission reflective film 7 is formed at one end of a semiconductor optical amplifier (SOA) 4, and a reflector (a mirror of total reflection) 6 is arranged apart from the semiconductor optical amplifier 4 in such a manner to hold the semiconductor optical amplifier 4 between the reflective film 7 and itself. The reflector 6 and the reflective film 7 constitute a resonator 1. Nonreflective coating is applied on an end face on the reflector 6 side of the semiconductor optical amplifier 4, and an acousto-optic tunable filter (AOTF) 3a is coupled, as a wavelength tunable filter, to the reflector 6 side of the semiconductor optical amplifier 4 by a butt joint technique. On the acousto-optic tunable filter 3a, a phase shifter 2 is integrated which changes in refractive index of its waveguide in accordance with the voltage applied thereto. Nonreflective coating is applied on both end faces of the acousto-optic tunable filter 3a.

Further, between the acousto-optic tunable filter 3a, on which the phase shifter 2 is integrated, and the reflector 6, a lens 8a and an internal etalon 5A are arranged in order from the acousto-optic tunable filter 3a side. The lens 8a collimates a beam emitted from the acousto-optic tunable filter 3a. The internal etalon 5A is formed of, for example, quartz and has a free spectrum range (FSR) of, for example, about 50 GHz.

In the external part of the resonator 1, a lens 8b for collimating and a beam splitter 9B are arranged in order from the reflective film 7 side in a manner to hold the reflective film 7 between the reflector 6 and them. The beam splitter 9B splits a part of the laser beam outputted after being transmitted by the reflective film 7. At the destination of the split beam, a photo-detector (PD) 10B is arranged. Between the beam splitter 9B and the photo-detector 10B, a beam splitter 9A and an external etalon 5B are further arranged in order from the beam splitter 9B side. The beam splitter 9A splits a part of the laser beam split by the beam splitter 9B. At the destination of the split beam, a photo-detector (PD) 10A is arranged. The external etalon 5B is formed of, for example, crystal and has a free spectrum range (FSR) of, for example, about 100 GHz. In the first embodiment, a wavelength-locking portion 12 includes the beam splitter 9A, the photodetector 10A, the external etalon 5B, and the photodetector 10B.

Further, a lens 8c is arranged in the path of the laser beam transmitted by the beam splitter 9B, and an optical fiber 11 is coupled to a position ahead.

The wavelength tunable laser device according to the first embodiment configured as above is cooled by, for example, a single thermoelectric cooler (TEC) such as a Peltier element or the like so that the whole device is controlled at a substantially uniform temperature.

Note that the tolerance of the internal etalon 5A of the wavelength tunable laser device having the configuration as described above is on the order of ±1 GHz and the tolerance of the external etalon 5B is on the order of ±8 GHz. Besides, an error in transmission peak wavelength caused by the angular shift during assembly is on the order of ±40 pm (±5 GHz) both in the internal etalon 5A and the external etalon 5B. Accordingly, the transmission peak wavelength of the internal etalon 5A may fall outside the tolerance range after assembly. In such a case, to correct the error in the transmission peak wavelength, the setting temperature of the whole device is changed by, for example, ±4.1° C. through use of the thermoelectric cooler. This temperature control allows the transmission peak wavelength of the internal etalon 5A to fall within its tolerance range and the transmission peak wavelength of the external etalon 5B to shift about ±2.6 GHz. In this event, even if the shift amount is superimposed on the error during assembly, the shift amount of the transmission peak wavelength of the external etalon 5B is 7.6 GHz at a maximum, which is within the tolerance range. Consequently, according to the first embodiment, an excellent wavelength accuracy can be attained.

When a laser beam is actually outputted, the phase of the laser beam resonating in the resonator 1 is controlled by matching the wavelength selected by the acousto-optic tunable filter 3a to the desired transmission peak wavelength of the internal etalon 5A and adjusting the refractive index of the waveguide constituting the phase shifter 2 based on the detection results of the photo-detectors 10A and 10B.

Figure 5:
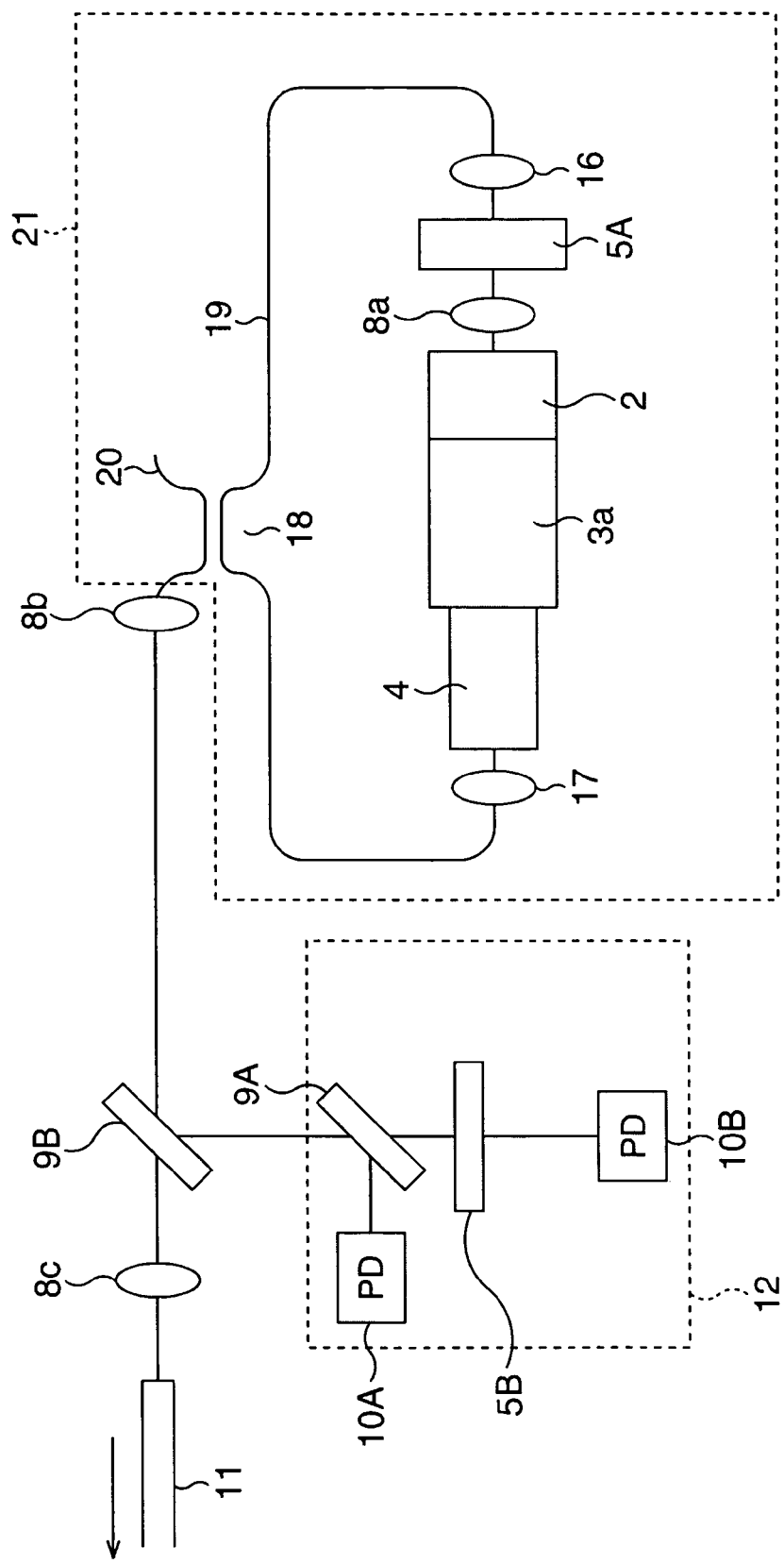
FIG. 5 is a schematic diagram showing a structure of a wavelength tunable laser device according to a second embodiment of the present invention.

Next, a second embodiment of the present invention will be explained. While the reflective optical resonator having two mirrors is used as the optical resonator in the first embodiment, a circulation-type optical resonator, in which components are arranged in an optical waveguide formed such that a beam circulates therein, is used in the second embodiment. FIG. 5 is a schematic diagram showing a structure of the wavelength tunable laser device according to the second embodiment of the present invention.

In the second embodiment, a semiconductor optical amplifier (SOA) 4, an acousto-optic tunable filter (AOTF) 3a, a phase shifter 2, a lens 8a, and an internal etalon 5A are arranged between a pair of lenses 16 and 17. The phase shifter 2 is integrated on the acousto-optic tunable filter 3a as in the first embodiment. Further, nonreflective coating is applied on an end face on the lens 17 side of the semiconductor optical amplifier 4.

The outsides of the lenses 16 and 17 are optically coupled with each other by an optical fiber 19. Further, the optical fiber 19 is provided with a coupler 18 which takes out a laser beam in the optical fiber 19 into an optical fiber 20. They constitute a circulation-type resonator 21. Further, a lens 8b is coupled to an end portion of the optical fiber 20. The other configuration is the same as that of the first embodiment.

In the second embodiment configured as above, a beam emitted from the phase shifter 2 integrated on the acousto-optic tunable filter 3a is collimated by the lens 8a. In the resonator 21, only a laser beam with a wavelength selected depending on superposed filter characteristics of the acousto-optic tunable filter 3a and the internal etalon 5A out of beams in a wide band of wavelengths generated by the semiconductor optical amplifier 4 circulates in an overlapping manner in a ring to thereby resonate, resulting in a laser oscillation. A part of the laser beam is taken out by the optical coupler (optical demultiplexer) 18 into the optical fiber 20 and is emitted to the wavelength-locking portion 12 and the outputting optical fiber 11 as collimated beam collimated by the lens 8b arranged ahead of an outlet port of the optical coupler 18.

While a quartz etalon is used as the internal etalon 5A and a crystal etalon is used as the external etalon 5B in the previously described embodiments, solid-state etalons made of other materials may be used depending on the ratio between the tolerance width of the internal etalon 5A and the tolerance width of the external etalon 5B. In addition to the solid-state etalon, an air-gap etalon may be used. The air-gap etalon is particularly suitable for the external etalon 5B since the rate of change in transmission peak wavelength of the air-gap etalon to temperature change is smaller than that of the solid-state etalon. Therefore, it is also adoptable that, for example, the internal etalon 5A is composed of a solid-state etalon and the external etalon 5B is composed of an air-gap etalon. Further, it is also adoptable to use, as the air-gap etalon, one arranged inside an airtight container.

In any case, however, the rate of change in transmission peak wavelength of the internal etalon 5A to temperature change needs to be made greater than that of the external etalon 5B. Especially when using a solid-state etalon, the rate of change in refractive index of the internal etalon 5A to temperature change needs to be made greater than that of the external etalon 5B. The free spectrum range of each of the etalons is not limited to that of the above-described embodiment. Further, it is also adoptable to employ a filter other than the etalon as a filter with a periodical transmission wavelength.

Besides, as a wavelength tunable filter, an acousto-optic tunable filter (AOTF) 3a is used in the above-described embodiments, whereas filters in other forms such as a reflection-type wavelength tunable filter utilizing a diffraction grating integrated one of the reflective members constituting the resonator can be used to obtain similar effects.

Additionally, layout of respective elements and the like should not be limited to those of the above-described embodiments. For example, the phase shifter 2 may be integrated on the semiconductor optical amplifier 4, not on the acousto-optic tunable filter 3a. Further, the beam splitter 9A may be arranged in the path of the laser beam transmitted by the beam splitter 9B as shown in FIG. 1.

Furthermore, while the configuration of the wavelength tunable laser portion composed of the resonator 1 or 21 is one in which the laser beam is taken out once in space in the above-described embodiments, it is also adoptable that the respective components (SOA, wavelength tunable filter, periodic optical filter, and so on) are integrated on a single substrate to form such a configuration that a part or all of the resonator components are monolithically integrated.

According to the present invention, the rates of change in the transmission peak wavelengths of the first and second optical filters with temperature change are appropriately determined, so that wavelength control can be conducted with a high accuracy while both the filters are being controlled at temperatures equal to each other.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A wavelength tunable laser device, comprising:
a semiconductor optical amplifier emitting a laser beam;
a wavelength tunable filter arranged in an optical path of the laser beam;
a first optical filter with a periodical transmission wavelength arranged in the optical path of the laser beam;
two reflective members arranged so as to sandwich said semiconductor optical amplifier, said wavelength tunable filter, said first optical filter, therebetween, said two reflective members being resonating the laser beam;
a phase shifter controlling a phase of the laser beam resonating between said two reflective members;
a first unit to split light and a second unit to split light, each splitting a part of the laser beam passing through one of said two reflective members;
a first optical detector detecting an intensity of the laser beam split by said first unit to split light;
a second optical filter with a periodical transmission wavelength arranged in the optical path of the laser beam split by said second unit to split light, a rate of change in transmission peak wavelength of said first optical filter with a temperature change being greater than a rate of change in transmission peak wavelength of said second optical filter with the temperature change; and
a second optical detector detecting an intensity of the laser beam passing through said second optical filter,
wherein said first optical filter and said second optical filter are composed of different materials from each other.

2. The wavelength tunable laser device according to claim 1, wherein said first and second optical filters are composed of solid-state etalons, and a rate of change in refractive index of a material of said first optical filter to a temperature change is greater than a rate of change in refractive index of a material of said second optical filter to the temperature change.

3. The wavelength tunable laser device according to claim 1, wherein said first optical filter is composed of a solid-state etalon of quartz, and said second optical filter is composed of a solid-state etalon of crystal.

4. The wavelength tunable laser device according to claim 1, wherein said second optical filter is composed of an air-gap etalon.

5. The wavelength tunable laser device according to claim 4, wherein the air-gap etalon is arranged in an airtight container.

6. The wavelength tunable laser device according to claim 1, wherein said first and second optical filters are controlled to be at temperatures identical with each other.

7. The wavelength tunable laser device according to claim 1, wherein a period of the transmission wavelength of said second optical filter is a double of a period of the transmission wavelength of said first optical filter.

8. The wavelength tunable laser device according to claim 1, including an acousto-optic tunable filter as said wavelength tunable filter.

9. The wavelength tunable laser device according to claim 1, wherein one of said two reflective members and said wavelength tunable filter are integrated to constitute a reflection-type wavelength tunable filter.

10. The wavelength tunable laser device according to claim 1, wherein said first unit to split light is arranged in the optical path of the laser beam passing through said second unit to split light.

11. The wavelength tunable laser device according to claim 1, wherein said first unit to split light is arranged in the optical path of the laser beam split by said second unit to split light.

* * * * *